(12) United States Patent
Barrow

(10) Patent No.: US 8,248,741 B2
(45) Date of Patent: Aug. 21, 2012

(54) APPARATUSES AND METHODS FOR A SCR-BASED CLAMPED ELECTROSTATIC DISCHARGE PROTECTION DEVICE

(75) Inventor: Jeffrey G. Barrow, Tucson, AZ (US)

(73) Assignee: Integrated Device Technology, Inc., San Jose, CA (US)

(*) Notice: Subject to any disclaimer, the term of this patent is extended or adjusted under 35 U.S.C. 154(b) by 61 days.

(21) Appl. No.: 12/561,189

(22) Filed: Sep. 16, 2009

(65) Prior Publication Data

US 2011/0063764 A1    Mar. 17, 2011

(51) Int. Cl.
*H02H 9/00* (2006.01)
*H02H 3/22* (2006.01)

(52) U.S. Cl. .......................... 361/56; 361/111
(58) Field of Classification Search ............. 361/56, 361/111
See application file for complete search history.

(56) References Cited

U.S. PATENT DOCUMENTS

| | | |
|---|---|---|
| 5,225,702 A | 7/1993 | Chatterjee |
| 5,400,202 A | 3/1995 | Metz et al. |
| 5,528,188 A | 6/1996 | Au et al. |
| 5,767,537 A * | 6/1998 | Yu et al. .................. 257/111 |
| 7,186,594 B2 | 3/2007 | Yach et al. |
| 7,285,458 B2 * | 10/2007 | Manna et al. ............ 438/237 |
| 7,440,248 B2 * | 10/2008 | Arai et al. .................. 361/56 |

* cited by examiner

*Primary Examiner* — Jared Fureman
*Assistant Examiner* — Lucy Thomas
(74) *Attorney, Agent, or Firm* — TraskBritt P.C.

(57) ABSTRACT

A SCR-based based electrostatic discharge protection device with a shunt path is provided. The shunt path operates at a low resistance when an enabling signal of the shunt path is asserted and a high resistance when the enabling signal is negated. The shunt path connects the cathode and the gate of the silicon-controlled rectifier, and provides a conductive path for displacement current from a parasitic capacitance when the shunt path is enabled, such as when power is provided to the device, and further allows the SCR to enter a low-resistance state when the shunt path is not enabled, such as when power is not provided to the device. A threshold trigger circuit is operably coupled between the anode and the cathode of the silicon-controlled rectifier and is configured to provide a current path when the anode voltage reaches a predetermined value lower than a breakdown voltage of the silicon-controlled rectifier.

25 Claims, 11 Drawing Sheets

APPARATUSES AND METHODS FOR A SCR-BASED CLAMPED ELECTROSTATIC DISCHARGE PROTECTION DEVICE

TECHNICAL FIELD

Embodiments of the present disclosure relate generally to electrostatic discharge protection devices and, more particularly, to apparatuses and methods related to clamped silicon-controlled rectifier electrostatic discharge protection devices.

BACKGROUND

In modern electronic circuits, electrostatic discharge ("ESD") protection is an important feature for the protection of internal circuitry on semiconductor devices e.g., integrated circuits). ESD may be characterized by fast transient high voltage discharges resulting from two objects at different potentials coming in contact with each other, or when a high electrostatic field develops between two objects in close proximity. An ESD event in an integrated circuit (IC) may be caused by static electricity generated by a user, equipment handling the IC, power supply voltage transients, circuit testing, and the like. An ESD event may create a sufficiently high voltage to cause a destructive breakdown of transistor devices or components connected to the inputs or outputs of the integrated circuits. ESD is one of the major causes of device failure in the semiconductor industry.

FIG. 1 illustrates a conventional high voltage ESD protection circuit 100, which includes a single high voltage NPN ESD clamp 110, bond pad 140, and ground 150. NPN ESD clamp 110 includes an NPN transistor 120 and a resistor 130. The base of NPN transistor 120 and the emitter of NPN transistor 120 are connected by resistor 130. The NPN clamp 110 is coupled between bond pad 140 and ground 150 in that the collector of NPN transistor 120 is coupled to the bond pad 140 and the emitter of NPN transistor 120 is coupled to ground 150. The resistor 130 may be a large value resistor to eliminate spurious behavior during normal operation of NPN transistor 120.

In operation, IC designers generally achieve ESD protection by relying on the collector breakdown of the high voltage NPN ESD clamp 110 to turn on NPN transistor 120. This will cause NPN transistor 120 to clamp into its low resistive state at a voltage between Vbceo and Vbces.

Some high voltage circuits may be protected by a clamp with a single NPN transistor 110 as shown in FIG. 1. Other circuits may require a multiple stacked NPN ESD clamps. For example, a second high voltage NPN ESD clamp 115 is illustrated by FIG. 2. FIG. 2 illustrates a conventional high voltage ESD protection circuit 200, which includes a second NPN ESD clamp 115 connected in series with NPN ESD clamp 110 and between bond pad 140 and ground 150. The second NPN ESD clamp 115 includes transistor 125 and resistor 135 configured as before with NPN ESD clamp 110. Examples of circuits that may require multiple ESD clamps connected in series include supply rails or high voltage semiconductor devices used to level shift and drive thin film transistors (TFT) found on LCD panels.

For high voltage circuits, it is difficult to make ESD clamps that consume a small amount of die area. The clamps often need to be stacked, as shown in FIG. 2. In order to maintain the same path resistance, it is required to double the clamps in both parallel and in series. Therefore, in order to maintain the same ESD performance, four such cells are required. As a result, conventional high voltage NPN ESD transistor clamps 110, 115 consume a substantial amount of silicon area. The high voltage rating forces large lateral spacing rules, and the collector diffusion is lightly doped and therefore highly resistive, which further increases the footprint. For example, a twelve-channel TFT level shifter implemented in a high performance IC process with a double stacked 60V ESD cell may consume approximately 40,000 um$^2$. Embodiments of the present invention may reduce the required silicon area and cost of ESD protection in comparison with the existing NPN clamps of FIGS. 1 and 2. Additionally, embodiments of the present invention may electrically outperform their predecessors.

BRIEF SUMMARY OF THE INVENTION

Embodiments of the present invention include an electrostatic discharge protection device with a silicon-controlled rectifier with an anode, a cathode, and a gate, and a parasitic capacitance between the gate and an internal node of the silicon-controlled rectifier. The electrostatic discharge protection device further includes a shunt path connecting the cathode and the gate of the silicon-controlled rectifier. The shunt path is configured for allowing a conductive path for a displacement current from the parasitic capacitance when the shunt path is enabled by an enabling signal. The shunt path is further configured for allowing the silicon-controlled rectifier to enter a low resistance state when the shunt path is disabled by the enabling signal and a breakdown voltage is applied between the anode and the cathode.

In another embodiment of the present invention, a circuit for protecting a bond pad is provided. The circuit includes a silicon-controlled rectifier with an anode, a cathode coupled to a ground, and a gate. The circuit further includes a bond pad connected to the anode and a threshold trigger circuit electrically coupled between the anode and the cathode of the silicon-controlled rectifier. The threshold trigger circuit is operably coupled to a second gate of the silicon-controlled rectifier and configured to provide a current path therethrough when the anode voltage reaches a predetermined value lower than a breakdown voltage of the silicon-controlled rectifier.

Another embodiment of the present invention includes a method for protecting a circuit from electrostatic discharge. The method includes providing a controlled current path between a bond pad and ground with a silicon-controlled rectifier. The controlled current path is responsive to a gate of the silicon-controlled rectifier. The method further includes providing a shunt path between the gate and the ground. The shunt path is at a low resistance when it is enabled, and at a high resistance when it is disabled.

Another embodiment of the present invention includes a method for protecting a bond pad from excessive voltage. The method includes connecting a silicon-controlled rectifier between a bond pad and ground. The method further includes providing a threshold trigger between the bond pad and the ground, with the threshold trigger being operably coupled to a second gate of the silicon-controlled rectifier. The threshold trigger circuit allows a voltage on the bond pad up to a normal operating voltage and clamps voltage on the bond pad to a predetermined level below a breakdown voltage of the silicon-controlled rectifier.

Yet another embodiment of the present invention includes an integrated circuit. The integrated circuit includes a plurality of semiconductor devices and at least one electrostatic discharge protection circuit. The at least one electrostatic discharge protection circuit includes a silicon-controlled rectifier including an anode, a cathode, and a gate. The electrostatic discharge protection circuit further includes a shunt path connecting the gate and the cathode of the silicon-controlled rectifier. The shunt path is configured to have a low resistance when the integrated circuit is mounted and powered. The shunt path is configured to have a high resistance when the integrated circuit is not receiving power.

DETAILED DESCRIPTION

Embodiments of the present invention include apparatuses and methods for protecting a circuit from ESD using a silicon-controlled rectifier. A silicon-controlled rectifier ("SCR") is a common discrete electronic device used in many power applications such as motor control and light dimming. SCR circuits have characteristics that are especially well-suited for ESD protection circuits in that they are able to clamp. However, one drawback for using SCRs for ESD protection is that they also susceptible to dynamic turn-on. As described below, SCRs encounter parasitic capacitance at the junction level between the two effective base connections. This may lead to false triggering. Once turned on, an SCR may not easily be turned off, if at all, which may lead to a destructive SCR trigger that may blow fuses or damage a power supply.

Figure 3A:
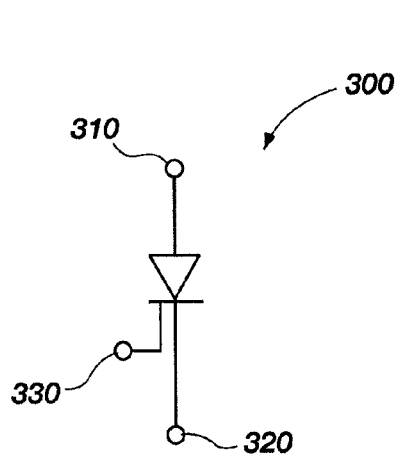
FIG. 3A illustrates the schematic symbol for a silicon-controlled rectifier.

FIG. 3A illustrates the schematic symbol for an SCR 300. SCR 300 has an anode 310, cathode 320, and gate 330. SCR 300 is a rectifier circuit in that current flow is unidirectional from the anode 310 to the cathode 320. In operation, a typical SCR is controlled by applying a voltage at the gate 330 to turn on SCR 300. SCR 300 may also be turned on by exceeding its forward breakdown voltage, such as by an ESD event. A third way for SCR to be turned on is dynamically due to internal parasitic capacitances. These latter two ways will be discussed later with reference to ESD protection devices of FIGS. 4-9.

Figure 3B:
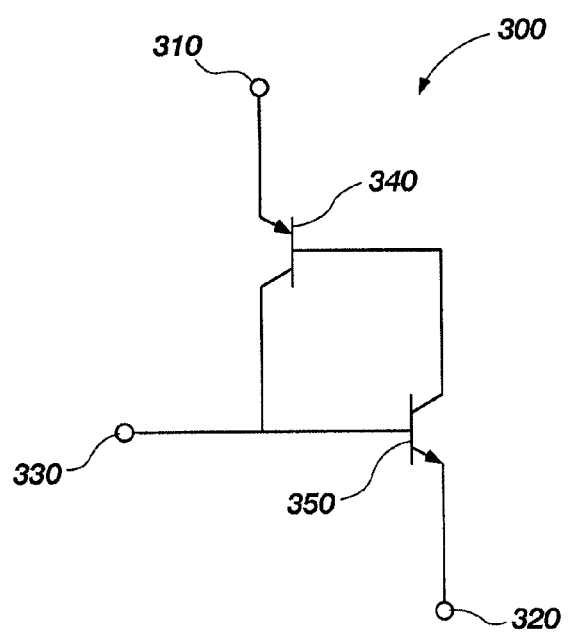
FIG. 3B illustrates an equivalent schematic of a silicon-controlled rectifier.

In order to better understand its operation, an equivalent schematic of SCR 300 is illustrated by FIG. 3B. In FIG. 3B, SCR 300 includes a PNP transistor 340 connected to an NPN transistor 350 such that the collector of each transistor connects to the base of the other transistor. The method of securing SCR conduction is called triggering. Before the device is triggered to its on state, neither transistor is on. In that case, there is no base drive and both transistors remain off When the gate 330 is pulled high by a voltage sufficient to turn on the NPN transistor's 350 base-emitter's junction, the NPN transistor's 350 collector conducts current thereby forward biasing the base-emitter junction of the PNP transistor 340. The PNP transistor's 340 collector pulls up the NPN transistor 350 base which drives the PNP transistor 340. This regenerative cycle continues until the SCR 300 is on. Once current starts to flow from the anode 310 to the cathode 320, the SCR 300 maintains its on state, and may only be turned off by forcing the base-emitter junctions off through some external mechanism or by interrupting the current flow as might happen at the crossover point in an AC circuit. In high voltage applications, this regenerative mechanism may be extremely difficult to turn off.

Figure 3C:
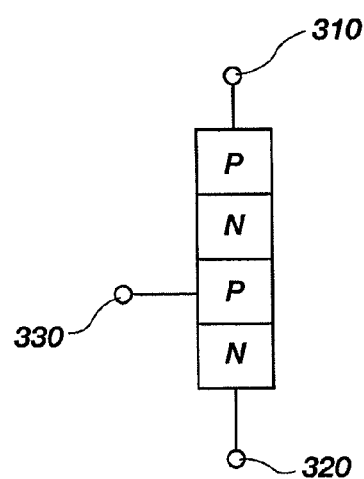
FIG. 3C illustrates a physical representation of a silicon-controlled rectifier.

It should be noted that although it is the schematic equivalent of SCR 300, FIG. 3B does not completely represent the actual physical layout or operation of SCR 300. FIG. 3C illustrates a physical representation of SCR 300. Physically, SCR 300 has four layers of P-type and N-type of semiconductor material including three P-N junctions. Anode 310 is connected to the first P-type layer. Gate 330 is connected to the second P-type layer. In general, an integrated SCR may not have metal connections from the collectors to the respective base terminals. Therefore, SCR 300 may only have two metal to silicon connections (rather than four) to the anode, cathode, and a third low current connection to a trigger, which results in less parasitic series resistance. SCR 300 also operates by recombining holes injected from the top P-N junction with electrons injected by the bottom P-N junction entirely within the silicon to meet in the lightly doped high voltage collector regions and recombine in about ½ the distance as would be indicated by the equivalent schematic and without current flow through unnecessary metal-silicon contacts. SCRs are also able to handle a much higher current density than regular conventional NPN ESD clamps. SCR 300 is, therefore, a compact and highly conductive device. If not for several limitations, SCR 300 would make an excellent ESD clamp device. One of these limitations becomes apparent with reference to FIG. 4.

Figure 4:
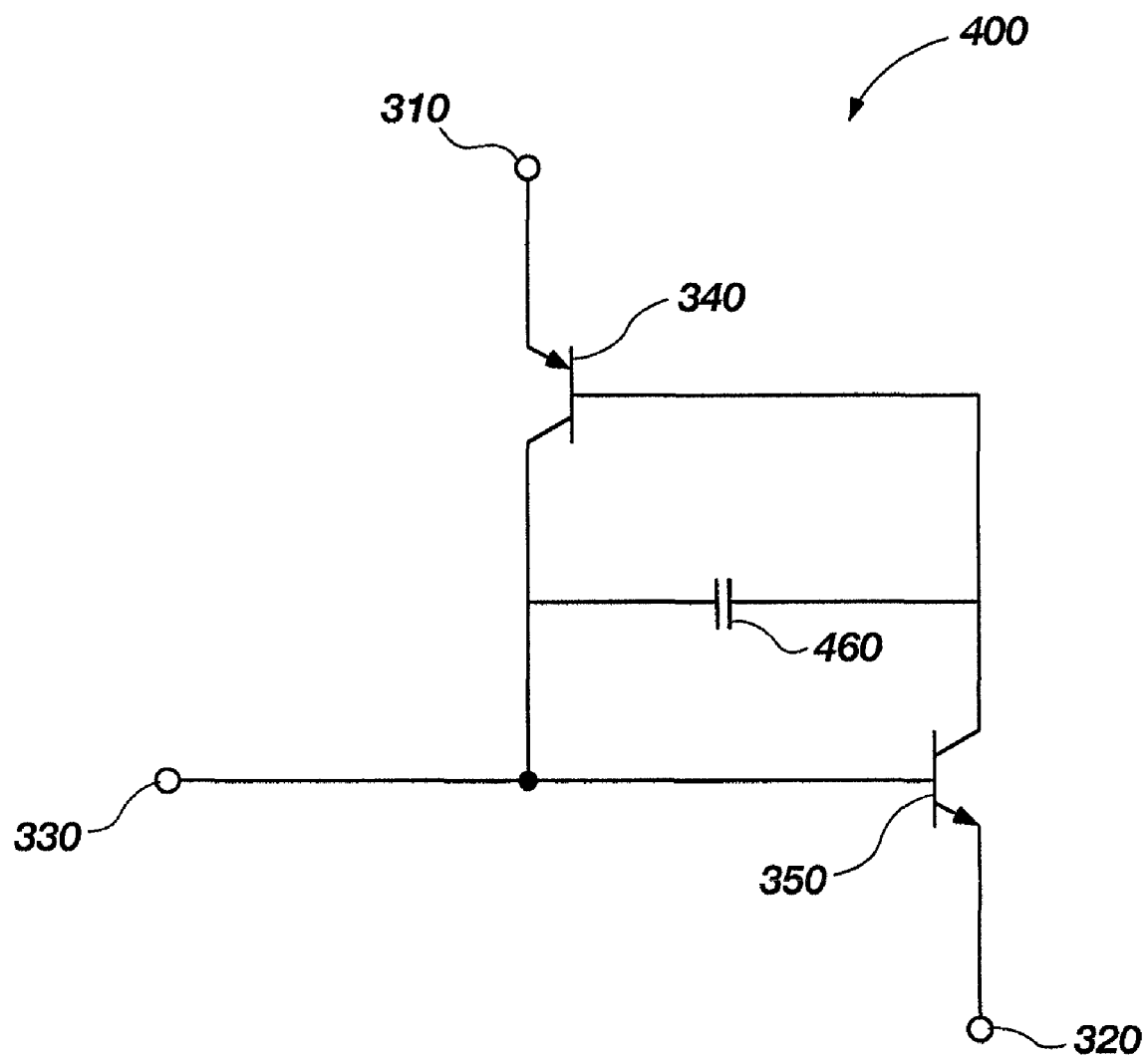
FIG. 4 illustrates a silicon-controlled rectifier recognizing that parasitic capacitance exists connecting the bases of the PNP transistor and NPN transistor.

FIG. 4 illustrates an SCR 400 with an anode 310, cathode 320, and gate 330. SCR 400 is represented by an equivalent schematic with PNP transistor 340 and NPN transistor 350 configured as before with respect to FIG. 3B. FIG. 4 recognizes that parasitic capacitance exists connecting the bases of the PNP transistor 340 and NPN transistor 350. This parasitic capacitance is represented in FIG. 4 by parasitic capacitor 460.

Parasitic capacitance causes a phenomenon called "dynamic turn-on" which may make SCRs undesirable for use as an ESD protection device. Whenever the anode 310 to cathode 320 voltage increases rapidly (i.e., there is a large dV/dt), the parasitic capacitor 460 holds the of base of PNP transistor 340 and NPN transistor 350 together while the emitters of each transistor separate, resulting in displacement current flow through the parasitic capacitor 460 and also, therefore, in the base-emitter junctions of the two transistors thereby potentially turning them on. Once on, the regenerative feedback takes over, and the SCR 400 latches into its low resistance state.

Latching into the low resistance state may be a major issue with using a SCR as an ESD clamp. For example, if a conventional SCR-based ESD clamp were used on a voltage supply rail and a glitch triggers the SCR by way of the dynamic turn-on, the SCR-based ESD clamp will do all it can to short, latch, and maintain that short, to ground. As a result, if a system including the latched SCR is fused, the fuse will likely blow. If the system is not fused, the short may prevent normal operation or even cause permanent damage to the IC or printed circuit board (PCB) including the IC with the SCR. The susceptibility to dynamic turn-on and the fact that SCRs latch into a low resistance state discourages most, if not all, IC designers from using a conventional SCR for ESD protection.

Figure 5:
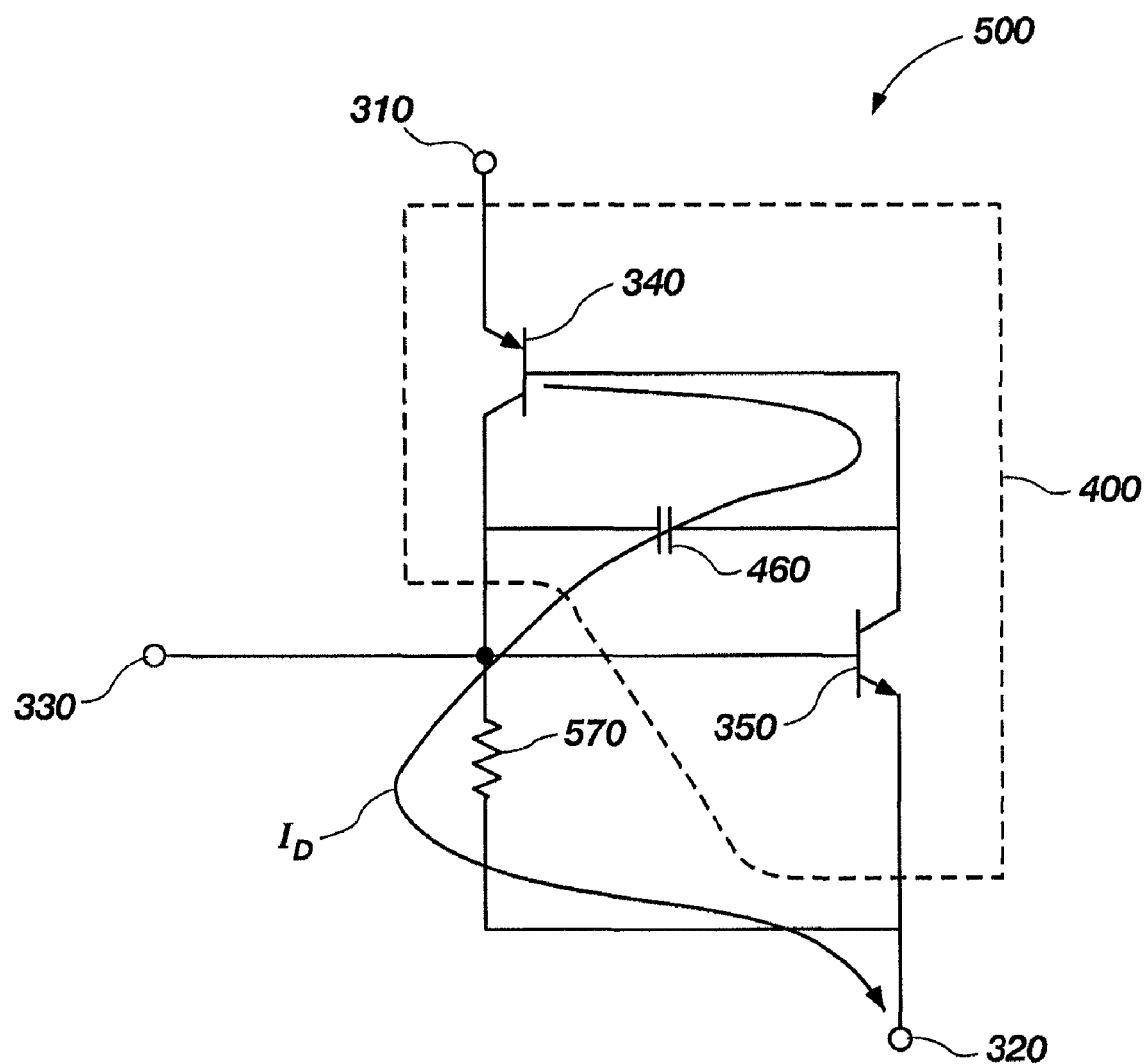
FIG. 5 illustrates a silicon-controlled rectifier with a shunt path for the displacement current of a parasitic capacitor.

FIG. 5 shows one solution to the problem of dynamic turn-on due to the existence of parasitic capacitance. FIG. 5 illustrates a SCR 500 with a shunt path for the displacement current Id of a parasitic capacitor 460. SCR 500 includes an anode 310, cathode 320, gate 330, and shunt resistor 570. SCR 500 further includes the same basic SCR structure of SCR 400 from FIG. 4, which is represented by the equivalent circuit configured as before with PNP transistor 340, NPN transistor 350. The existence of parasitic capacitance is represented by parasitic capacitor 460.

Some discrete SCRs may have shunt resistor 570 placed between the NPN transistor's 350 base and emitter (i.e., connecting the gate 330 and the cathode 320) to provide a shunt path for the parasitic capacitor's 460 displacement current Id to flow around the base-emitter junction thereby reducing the likelihood of turn-on. The SCR 500 may still be triggered with a large enough positive pulse on the base of the NPN transistor 350, or by exceeding the breakdown voltages of PNP transistor 340 and NPN transistor 350. The shunt resistor 570 may be useful and effective at preventing false triggering and dynamic turn-on; however, adding the shunt resistor 570 also reduces the SCR's sensitivity to certain real ESD events, and therefore reduces its ability to act as an ESD clamp.

For example, connecting shunt resistor 570 to one of the base terminals provides a shunt path to allow the displacement current Id to flow through from the parasitic capacitor 460. With the shunt resistor 570, a time constant is introduced with the parasitic capacitor. The time constant will depend on the values of the shunt resistor 570 and parasitic capacitor 460. The effectiveness of the shunt path to prevent a false trigger is dependent on IC processing and the values of the components. The IC designer generally only has control over this time constant by changing the value of the shunt resistor 570. An IC designer may be able to control the parasitic capacitance to some extent by making the SCRs smaller and smaller, but there is an eventual limitation on the designer's control. This is not a good solution for an IC -especially in situations where one may expect to see transients. Sensitivity is even more and more important as transients are getting faster and faster. For example, suppose a 1V glitch occurs in a power supply for about 1 nanosecond. Where Id =dV/dt * capacitance, if the parasitic capacitor 460 has a value of 1 pF, there may be 1 mA of displacement current Id. If the IC designer had chosen a shunt resistor 570 of 1 kOhm, a 1V pulse may result across the shunt resistor 570 as a voltage at the base of the NPN transistor 350. This voltage may cause a false trigger forcing the SCR 500 to turn on. Thus, SCR 500 may still go into its regenerative state despite the existence of the shunt resistor 570.

If the IC designer instead had chosen 500 ohms as shunt resistor 570, there would be 0.5V at the node, which likely would not trigger the NPN transistor 350. Lowering the value of shunt resistor 570 may reduce the problem of false triggering in the case of the IC being in the PCB with normal conditions. However, if the IC is not yet mounted on the PCB (e.g., in a manufacturing environment or testing in a lab) it is unlikely to encounter glitches that cause a false trigger. In these circumstances, it is desired for a real ESD event to turn on the SCR in its regenerative latching state. However, the shunt path through shunt resistor 570 still exists. Having a low value resistor will reduce the SCR's effectiveness to react to an ESD pulse because the shunt resistor 570 creates a low resistance shunt path for the current to bypass the NPN transistor 350, which does not allow the SCR to latch in its "on" state. The shunt path through shunt resistor 570 may be helpful in order to reduce false triggering when the IC is powered if the value of the shunt resistor 570 is small, but it may be harmful when the IC is not powered. Thus, the sensitivity of the SCR to an ESD pulse is significantly decreased when the IC is not powered which is also the time when the risk of ESD may be the greatest.

Figures 6A, 6B:
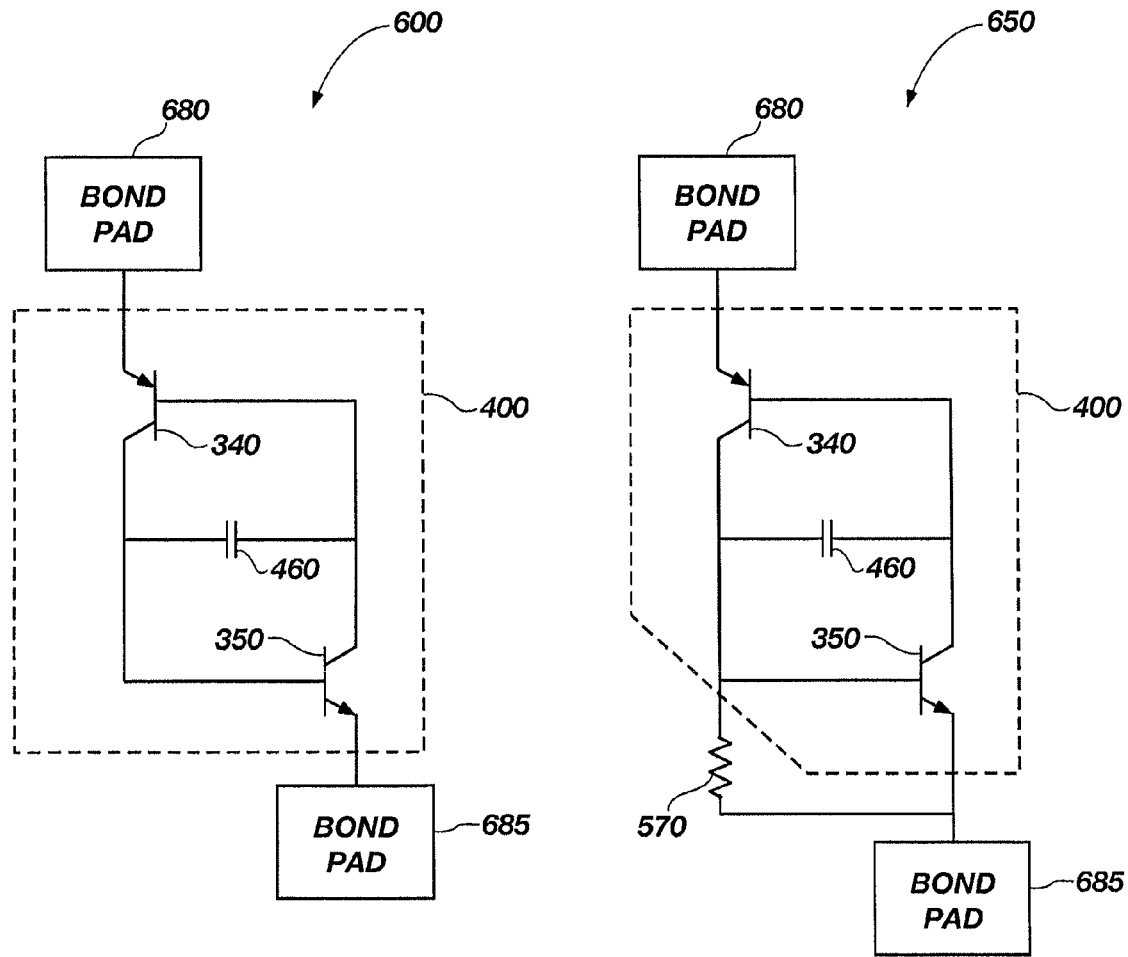
FIG. 6A illustrates a conventional silicon-controlled rectifier ESD clamp.
FIG. 6B illustrates a conventional silicon-controlled rectifier ESD clamp with an additional shunt resistor.

Despite the disadvantages listed above, conventional SCR-based ESD clamps, as shown in FIGS. 6A and 6B, are currently available in many design kits. FIG. 6A illustrates a conventional SCR ESD clamp 600 with a SCR 400 coupled to bond pads 680 and 685. The SCR 400 is the same as the basic SCR-equivalent structure of FIG. 4 including a PNP transistor 340 and NPN transistor 350. Parasitic capacitance exists, and as before, is represented by parasitic capacitor 460 located between the bases of PNP transistor 340 and NPN transistor 350.

FIG. 6B illustrates a conventional SCR ESD clamp 650 with an additional shunt resistor 570. SCR ESD clamp 650 includes the same basic SCR equivalent structure 400 connected between bond pads 680 and 685 as with FIG. 6A, but further includes shunt resistor 570 connected between the base of the NPN transistor 350 and the bond pad 685. Shunt resistor 570 serves the same purposes, and includes the disadvantages described by the text accompanying FIG. 5.

In operation, and as previously described, the voltage potential differences between bond pads may move apart at some rate (dV/dt). The displacement current Id is equal to dV/dt multiplied by the capacitance of parasitic capacitor 460. The displacement current Id has to have a path to ground. If shunt resistor 570 does not exist, as in FIG. 6A, the current will flow through the NPN transistor 350 which will turn on the PNP transistor 340, regenerate, and take the SCR to its clamped state. If the shunt resistor 570 exists, as with FIG. 6B, the displacement current remains the same (dV/dt * parasitic capacitance). However, now there is a potential across the shunt resistor 570 that is equal to the peak displacement current Id multiplied by the value of shunt resistor 570. If that voltage gets above 0.6 volts, it will trigger the NPN transistor 350 which turns on the PNP transistor 340 starting the regenerative cycle and taking the SCR into its latched state. Shunt resistor 570 must be low enough in value such that the voltage over that resistor (peak displacement current Id multiplied by the resistance) must be lower than about 0.6V, although practically speaking, the voltage must be lower than about 0.3V to ensure that there is not a false trigger. Thus, the resistor must be extremely small. As previously discussed, the smaller the shunt resistor 570, the less sensitive the SCR becomes to real ESD events.

Although such SCR ESD clamps are available, most IC designers are very reluctant to use conventional SCR-based ESD clamps because of the disadvantages discussed above.

Figures 1, 2:
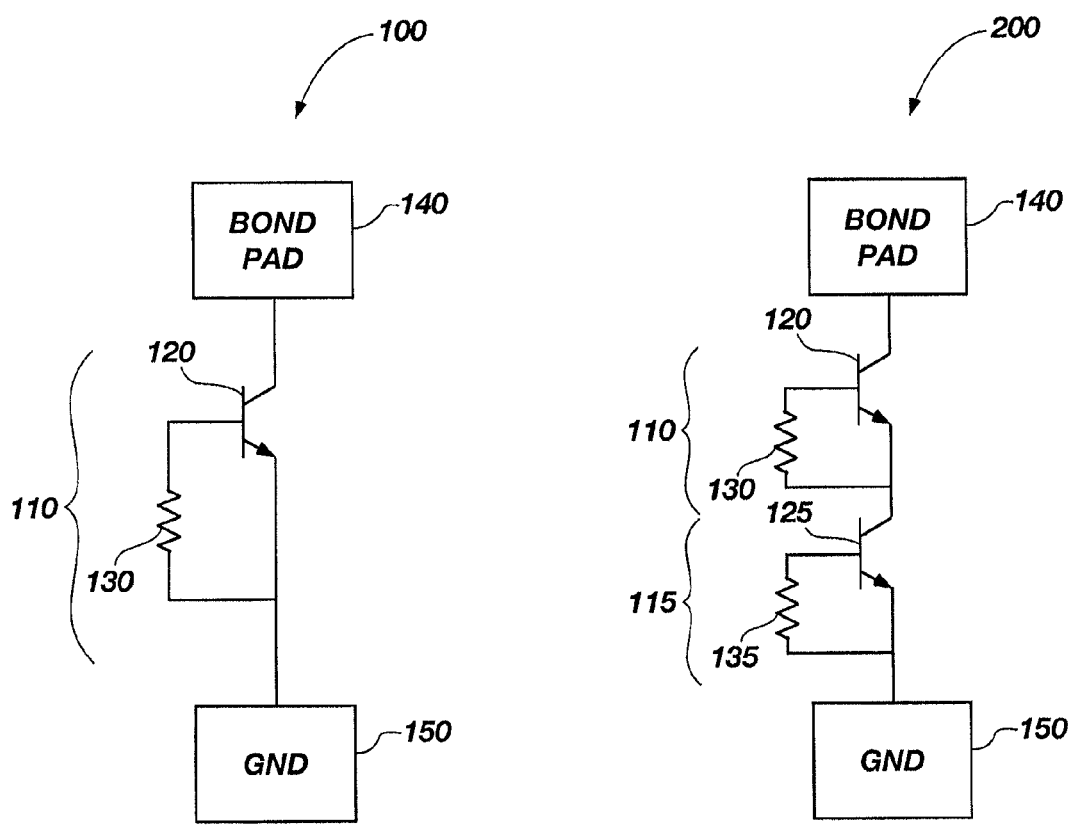
FIG. 1 illustrates a conventional high voltage ESD protection circuit with a single high voltage NPN ESD clamp.
FIG. 2 illustrates a conventional high voltage ESD protection circuit with a second NPN ESD clamp connected in series with a first NPN ESD clamp.

However, because of the better than two-to-one die area savings and the superior electrical clamping characteristics when compared to the conventional high voltage ESD circuits of FIGS. 1 and 2, a SCR-based ESD clamp remains highly desirable. Keeping in mind the disadvantages discussed above, such a SCR-based ESD clamp may be desirable if immune to false triggering due to the dynamic turn-on, while remaining sensitive to transients from real ESD events when they are most likely to occur.

Figure 7:
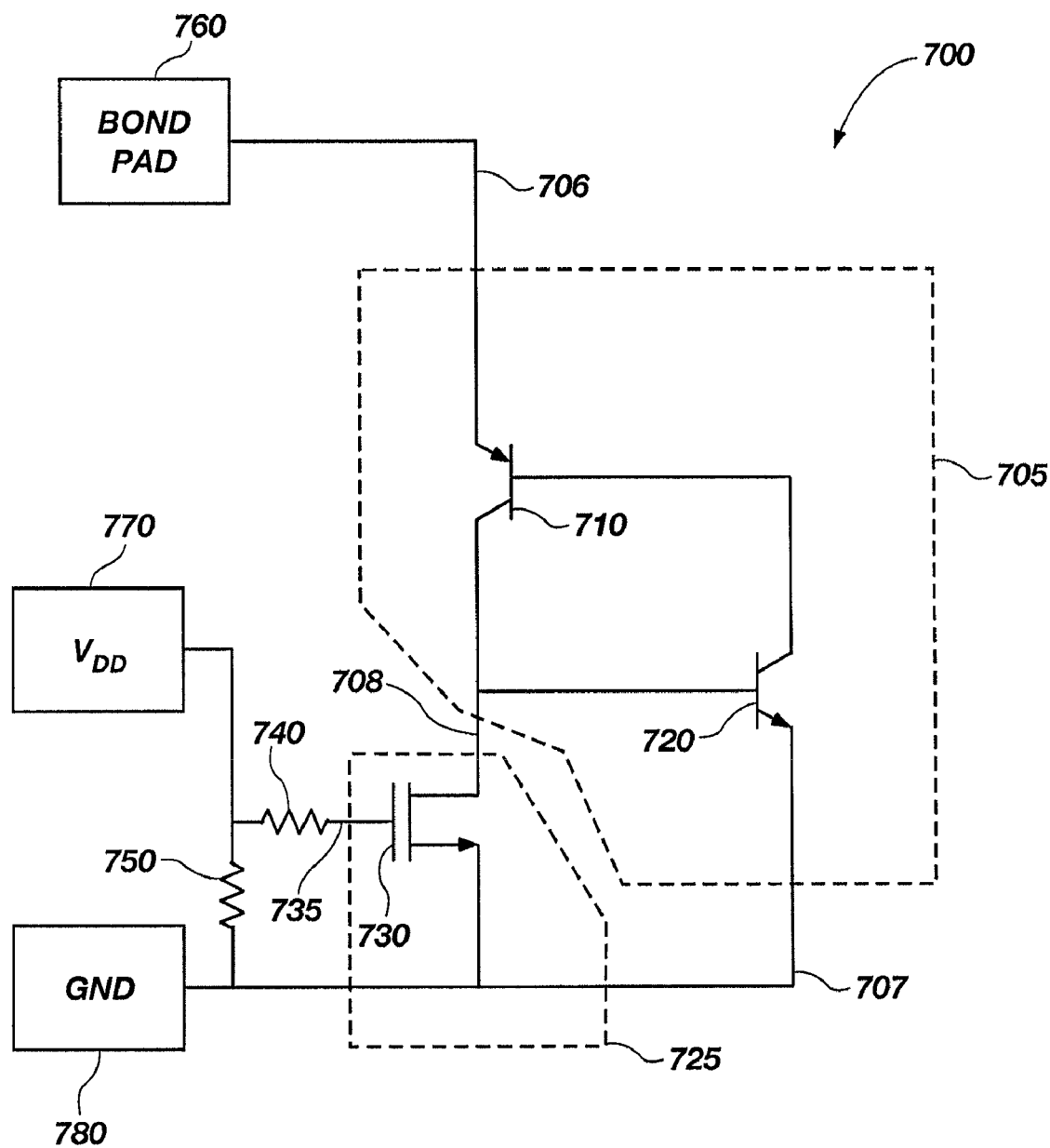
FIG. 7 illustrates a silicon-controlled rectifier-based ESD clamp according to an embodiment of the present invention.

FIG. 7 illustrates a SCR-based ESD clamp 700 according to an embodiment of the present invention. ESD clamp 700 includes a SCR 705, and a shunt path 725. ESD clamp further includes resistors 740 and 750, bond pad 760, power supply Vdd 770, and ground 780. SCR 705 includes an anode 706, cathode 707, and gate 708. As previously discussed, SCRs may be thought of schematically as behaving as a PNP transistor 710 and NPN transistor 720 configured such that the base of PNP transistor 710 is connected to the collector of NPN transistor 720, and the base of NPN transistor 710 is connected to the collector of PNP transistor 720.

Shunt path 725 may be configured to allow a conductive path for a displacement current from a parasitic capacitance when the shunt path 725 is enabled by an enabling signal 735, and further configured to allow the SCR 705 to enter its low resistance state if a breakdown voltage is met between the anode 706 and cathode 707 when the enabling signal 735 is negated. In the embodiment of FIG. 7, the enabling signal 735 is resistively coupled to a Vdd pad 770 through resistor 740. However, the enabling signal 735 is not so limited. By way of further example, the enabling signal may be coupled to an internal signal on the IC or a dedicated bond pad on the IC.

In the embodiment of FIG. 7, the shunt path 725 may be configured to assert the enabling signal 735 and operate at a low resistance when an IC is connected to the power supply 770, and negate the enabling signal 735 and operate at a high resistance when power to the shunt path 725 is not present from the power supply 770. Shunt path 725 may include shunt transistor 730 connected between the gate and cathode of the SCR 705. Resistor 740 may protect the gate oxide of shunt transistor 730 from an ESD event on the Vdd pad 770. Resistor 750 holds shunt transistor 730 off when there is no power to the IC.

In operation, shunt transistor 730 becomes a path for the parasitic capacitor's unwanted displacement current (not shown, refer to FIGS. 4 and 5) around NPN transistor 720. Thus, when shunt transistor 730 is on, its on resistance may be very small such that the voltage at the node at the base of NPN transistor 720 is small enough not to trigger the NPN transistor 720 and the SCR 705 into its regenerative clamped state due to unwanted displacement current. The shunt transistor 730, therefore, provides a very effective path for the displacement current to flow. When there is no supply voltage, enabling signal 735 is negated, and shunt transistor 730 is turned off, causing the shunt path 725 to be a high resistance path. This allows the SCR 705 to be very sensitive and susceptible to any type of transient voltages between the bond pad 760 and the ground 780. Therefore, the IC is waiting to trigger and clamp the SCR 705 if an ESD event occurs.

In other words, under conditions in which ESD is most likely an issue for an IC, the Vdd power supply is off and the IC is unpowered. In this embodiment, when Vdd is off, (enabling signal 735 is negated) and shunt transistor 730 is also off and has no effect on the SCR ESD clamping characteristics. However, when the IC is turned on, Vdd is present (enabling signal 735 is enabled) which also turns on shunt transistor 730. This allows the parasitic capacitor displacement current to have a low resistance path through shunt path 725 to safely flow around the base-emitter junction of the NPN transistor 720. Thus, SCR clamp 705 will be less likely to trigger upon a fast changing differential signal between the bond pad 760 and the ground 780.

Unlike the shunt resistor 570 (FIG. 5) that must be carefully chosen to trade off the benefits of shunting displacement current against the downside of reducing trigger sensitivity, the shunt transistor 730 may be optimized for peak performance under both conditions. Under ESD threat conditions, shunt transistor 730 is off and any sudden change in anode to cathode voltage will trigger the SCR clamp and prevent damage. During operation when ESD is less likely, enabling signal 735 is enabled when Vdd is present in the IC, which causes shunt transistor 730 to be on. This provides a low resistance path for parasitic capacitor displacement current Id to safely flow around the base-emitter junction of the NPN transistor 720 such that the glitches do not cause SCR clamp 705 to dynamically turn on due to false triggers. Thus, as a non-limiting example, shunt transistor 730 is configured to cause the circuit to be unresponsive to the displacement current through the parasitic capacitor when mounted to a PCB. When the IC is not mounted on a PCB and not receiving power, then it is desirable for the SCR to trigger by that dynamic effect.

Shunt transistor 730 may be a low voltage, short channel NMOS transistor with a very low "on" resistance. However, other types of transistors may be appropriate to create a low "on" resistance when connected to a power supply, and a high resistance "off" state when power to the transistor is not present. A low-voltage NMOS transistor may be desirable because its physical implementation may be small.

Figure 8:
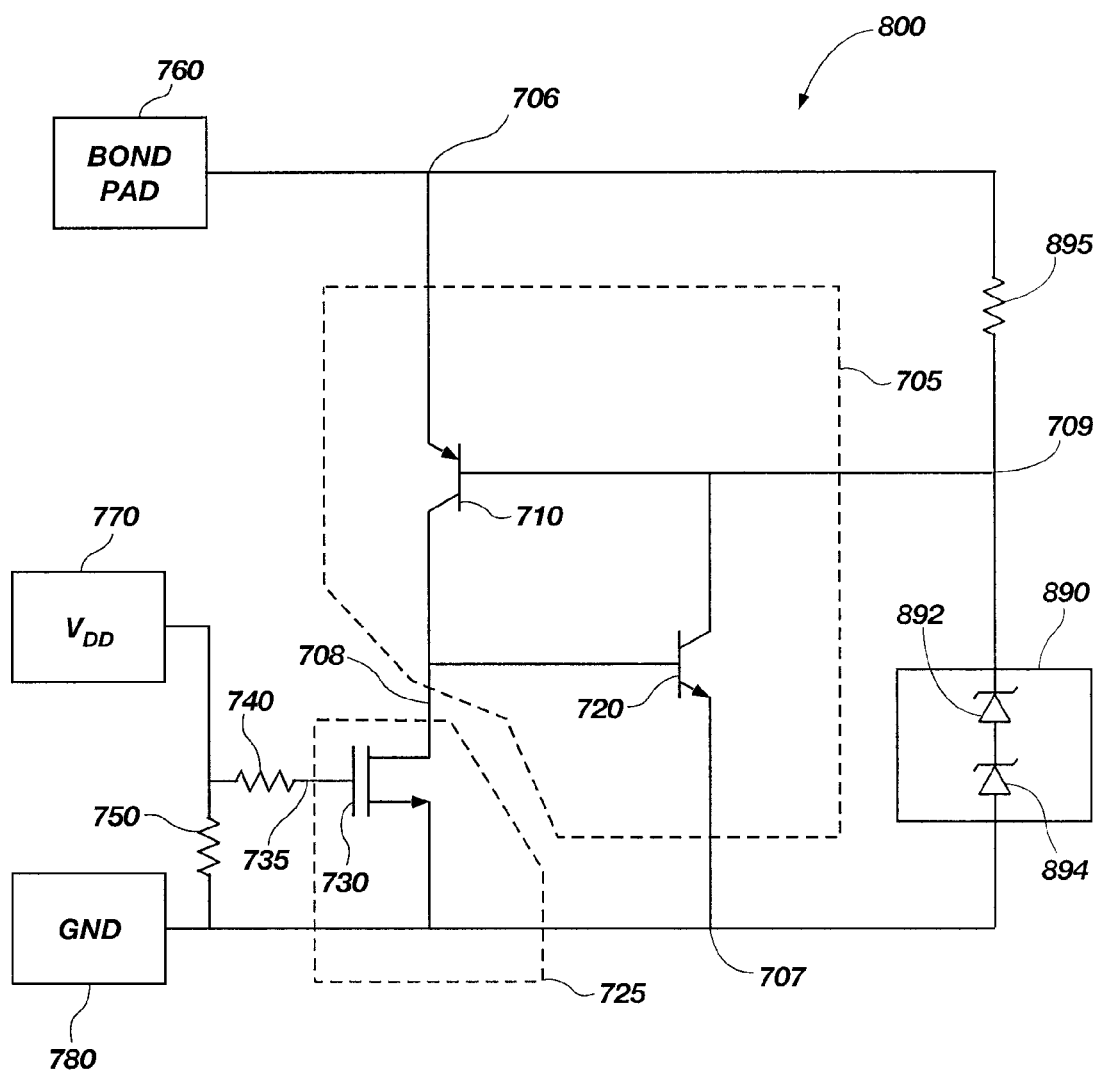
FIG. 8 illustrates a silicon-controlled rectifier-based ESC clamp according to an embodiment of the present invention.

FIG. 8 illustrates a SCR-based ESD clamp 800 according to an embodiment of the present invention. ESD clamp 800 includes SCR 705. ESD clamp 800 may also include shunt path 725, resistors 740 and 750, bond pad 760, power supply Vdd 770, and ground 780 each configured as before as in FIG. 7. Alternatively, the ESD clamp may include a resistor 570 between the gate 708 and the ground 780, such as is shown in FIG. 5.

SCR 705 includes an anode 706, cathode 707, and gate 708. In the embodiment of FIG. 8, the SCR 705 also includes a second gate 709 between the anode 706 and the gate 708 such that it is coupled to the base of the PNP transistor 710 and the collector of the NPN transistor 720. As previously discussed, SCRs may be thought of schematically as behaving as a PNP transistor 710 and a NPN transistor 720 configured such that the base of PNP transistor 710 is connected to the collector of NPN transistor 720, and the base of NPN transistor 710 is connected to the collector of PNP transistor 720.

If configured as an enabled shunt path, shunt path 725 may be configured to allow a conductive path for a displacement current from a parasitic capacitance when the enabling signal 735 of the shunt path 725 is connected to power supply 770, and further configured to allow the SCR 705 to enter its low resistance state when power is not received by the enabling signal 735 of the shunt path 725, and a breakdown voltage is met between the anode 706 and the cathode 707. The shunt path 725 may be configured to operate at a low resistance when an IC is connected to a power supply 770, and operate at a high resistance when power to the shunt path 725 is not present from the power supply 770. Shunt path may include shunt transistor 730 connected between the gate and cathode of the SCR 705. Resistor 740 may protect the gate oxide of shunt transistor 730 from an ESD event on the Vdd pad 770. Resistor 750 holds shunt transistor 730 off when there is no power to the IC.

Additionally, ESD clamp 800 includes threshold trigger 890 and may include resistor 895. Threshold trigger 890 is electrically coupled with the SCR 705 between ground 780 and the second gate 709, which is coupled to the base of PNP transistor 710 and the collector of NPN transistor 720. Resistor 895, if present, is electrically coupled with the SCR 705 between the anode of SCR 705 and the threshold trigger 890. Threshold trigger 890 may be configured to provide a current path when the anode voltage reaches a predetermined value lower than the breakdown voltage of the SCR 705. Threshold trigger 890 may also be configured to allow a voltage on the bond pad 760 in its normal operating voltage range and clamp the anode voltage when the anode voltage exceeds a predetermined level below the breakdown voltage of the SCR 705.

The maximum voltage on the bond pad 760 that the SCR clamp 705 is trying to protect may be important. Threshold trigger 890 may be configured to protect against excessive anode to cathode voltages. These voltages may be slow changing. As the anode voltage rises with respect to the cathode voltage, it eventually reaches the potential where conduction occurs through the threshold trigger 890. Upon conduction, threshold trigger 890 pulls current through resistor 895 until the base-emitter junction at PNP transistor 710 turns on. Once on, PNP transistor 710 turns on NPN transistor 720. Regeneration then takes over, and the SCR clamps in the "on" state. Thus, resistor 895 coupled to the second gate 709 may serve a similar purpose as the shunt resistor 570 shown in FIG. 5. However, in this case, the path through resistor 895 is intended as a path for NPN transistor 720 collector leakage current so that DC and/or temperature effects do not cause false triggering.

In operation, it may be desirable to have a SCR clamp that will allow normal operation but disallow damaging voltages above a certain level. Trigger threshold 890 may be configured to set the trigger voltage at a precise level. Without trigger threshold 890, SCR clamp 705 may turn on at the lesser of breakdown voltages of PNP transistor 710 and NPN transistor 720. These breakdown voltages may actually be greater than what may be handled by the IC, which may cause damage to the IC. Therefore, there may exist a range of voltages that is higher than what is safe for the IC under normal operation, but still is not high enough to reach the breakdown voltage of the transistors 710, 720 to turn on the SCR clamp 705. Thus, the IC may be damaged. For example, gates of TFTs may operate up to 60V. A circuit may be designed that drives a 60V difference, which is also controlled by a microprocessor with a standard logic output of 2.5V. Normal operating voltage for such a circuit may be 60V. Therefore, it is desirable for the IC designer to be able to control the voltage threshold on the bond pads independent of the individual devices of the clamp (i.e., breakdown of PNP transistor 710 and NPN transistor 720), such that the ESD protection circuit is unresponsive up to a certain threshold to allow normal operation. However, it is also desirable to control the voltage level on the bond pond pad 760 such that the circuit triggers above that threshold so as not to experience voltages that may damage the IC.

Threshold trigger 890 may be used to set this voltage threshold. As a non-limiting example, the threshold trigger 890 may be configured as a small avalanche breakdown diode with the desired trigger threshold. For example, Zener diodes 892, 894 with reverse-bias breakdown voltages may be stacked and constructed with a reasonably precise voltage. For example, a first diode 892 may be a 40V clamp and second diode 894 may be a 5V clamp to produce a 45V combined effect. As the anode voltage increases above the combined 45V breakdown voltage of the Zener diodes, there will be a conductive path through the base-emitter junction of PNP transistor 710 through the threshold trigger 890 to the cathode 707. That may occur when the voltage is equal to Vbe of PNP transistor 710 plus the reverse breakdown voltage of the threshold trigger 890. Thereafter, PNP transistor 710 turns on which causes NPN transistor 720 to turn on and the regenerative cycle of the SCR 705 begins. Generally, an ESD clamp has to handle an enormous peak current, which requires the cell to be large. Threshold trigger 890 may not be required to handle such a large peak current, which allows the components (e.g., first and second diodes) to be smaller.

Although threshold trigger 890 is discussed as being one or more avalanche breakdown diodes connected in series, other implementations may exist that allow current to flow through threshold trigger 890 to disallow voltages above a certain level while maintaining the normal operating voltage of the circuit.

There are three models commonly used to test or simulate ESD under different situations where ESD may be generated. The first is a human body model ("HBM") in which a test is created to simulate the ESD event when a person touches an IC that is charged at another potential. The second is a charged device model ("CDM") in which a test is created to simulate the ESD event when a device charges to a certain potential and then contacts a conductive surface at a different potential. The third model is a machine model ("MM") in which a test is created to simulate the ESD event when a piece of equipment or tool contacts a device at a different potential.

Figure 9:
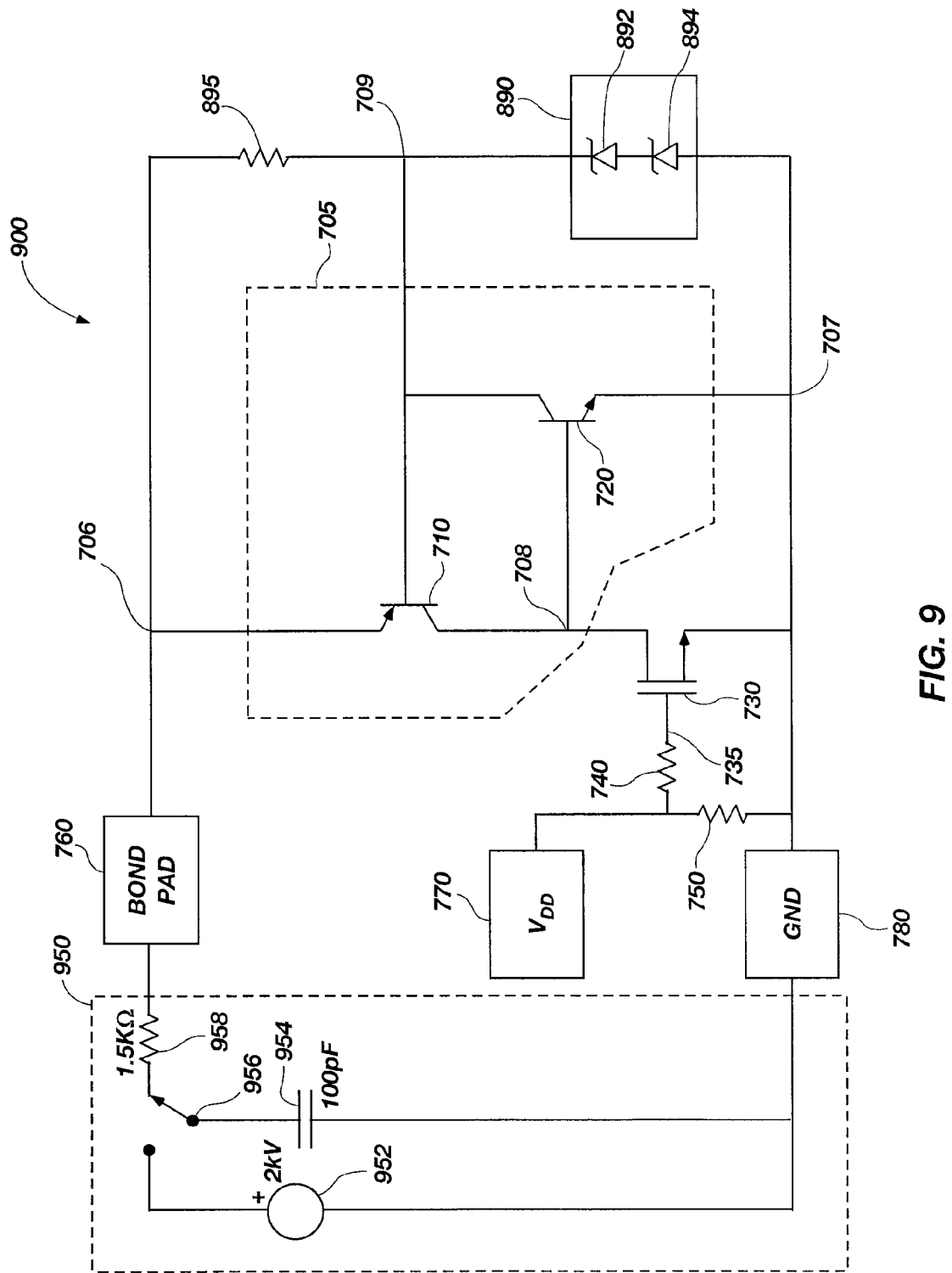
FIG. 9 illustrates a silicon-controlled rectifier-based ESD protection device set to be tested under a human body model according to an embodiment of the present invention.

FIG. 9 illustrates a SCR-based ESD protection device 900 set to be tested under an HBM 950 according to an embodiment of the present invention. SCR-based ESD protection device 900 is configured as before with reference to FIG. 8, including SCR 705, shunt path 725, threshold trigger 890, as well as the other components introduced previously. SCR-based ESD protection device 900 is coupled with HBM 950 through resistor 958. Power supply 952 and capacitor 954 are connected in parallel through switch 956. The values of the power supply 952, capacitor 954, and resistor 958 in this exemplary model are 2 kV, 100 pF, and 1.5 kOhms, respectively. According to different tests, Vdd may be powered or unpowered, and threshold trigger 890 may or may not be present.

In operation, switch 956 is closed as to the power supply 952 and the capacitor 954 in order to charge the capacitor 954. After the capacitor 954 has been charged, switch 965 opens as to the power supply 952, but closes as to the charged capacitor 954 and the device under test ESD protection device 900. The ESD protection device 900 under test is now exposed to a simulated HMB ESD event as the capacitor 954 discharges.

Figure 10:
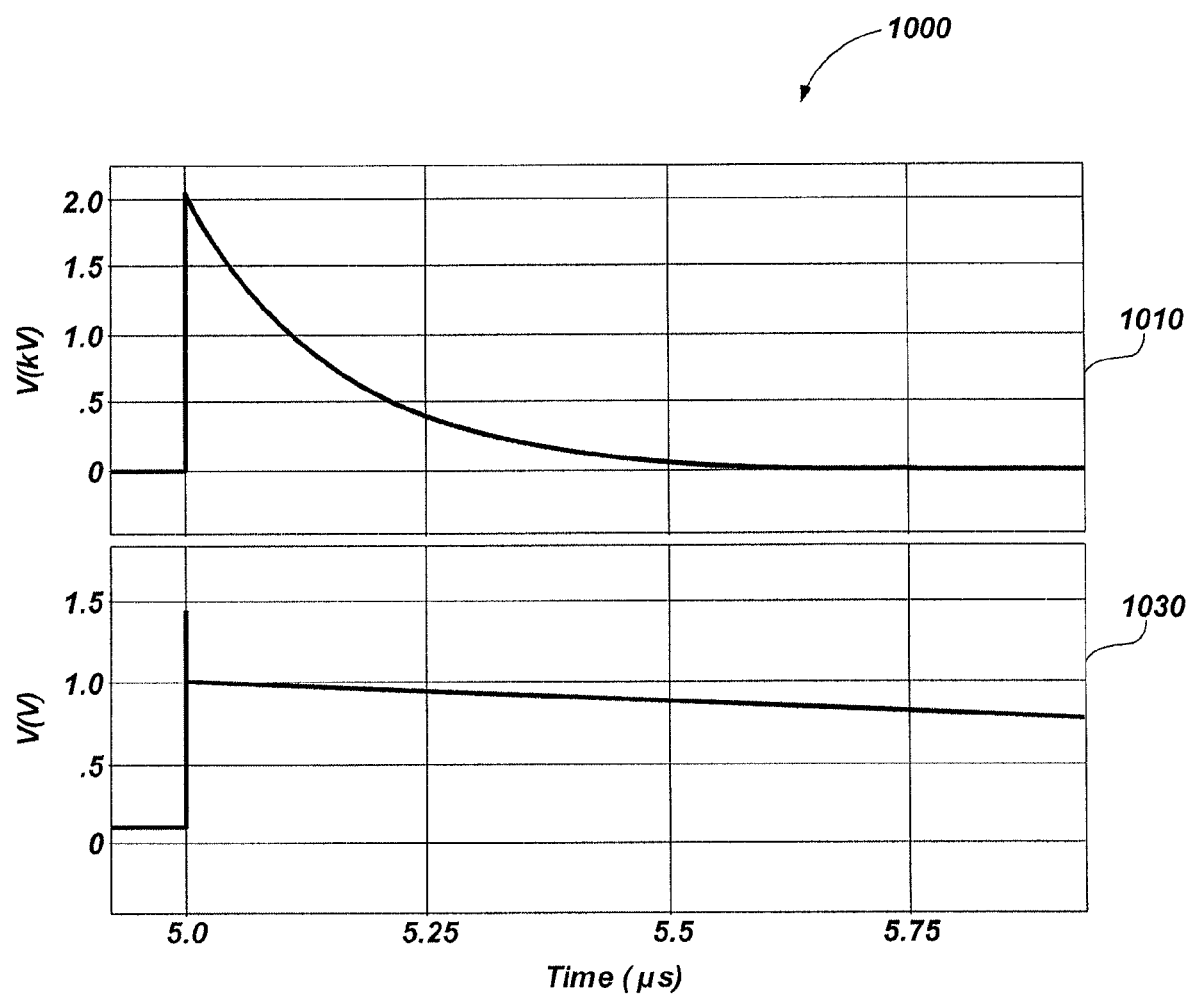
FIG. 10 illustrates a graph of a human body model simulation of a silicon-controlled rectifier-based ESD clamp according to an embodiment of the invention

FIG. 10 illustrates a graph 1000 of a HBM simulation of the SCR-based ESD protection device 900 according to an embodiment of the invention as shown in FIG. 9. The upper portion 1010 of the graph 1000 shows the voltage over time as measured at the top of the capacitor 954. The voltage axis is shown in kVolts for upper portion 1010. The lower portion 1030 of the graph 1000 shows the voltage over time as measured at the bond pad 760 of ESD clamp 900. The voltage axis is shown in Volts for the lower portion 1030.

In the test related to FIG. 10, Vdd was set to 0V to simulate the scenario when the IC is not mounted and not powered. With this simulation, threshold trigger 890 was also not present. In this simulation, bond pad 760 is zapped by a 2 kV HBM ESD at t =5.0 as shown schematically in FIG. 9. The upper portion 1010 of graph 1000 shows the resulting voltage at the top of the capacitor 954. The voltage shoots up at t =5.0 to 2 kV and decays down. The lower portion 1030 shows that the bond pad 760 voltage has been properly clamped to 1V by the SCR after which there is minor decay over time due to the RC time constant. Because Vdd was not present, the shunt transistor 730 was turned off, thus having little to no effect on the sensitivity or ability of the SCR to latch.

Figure 11:
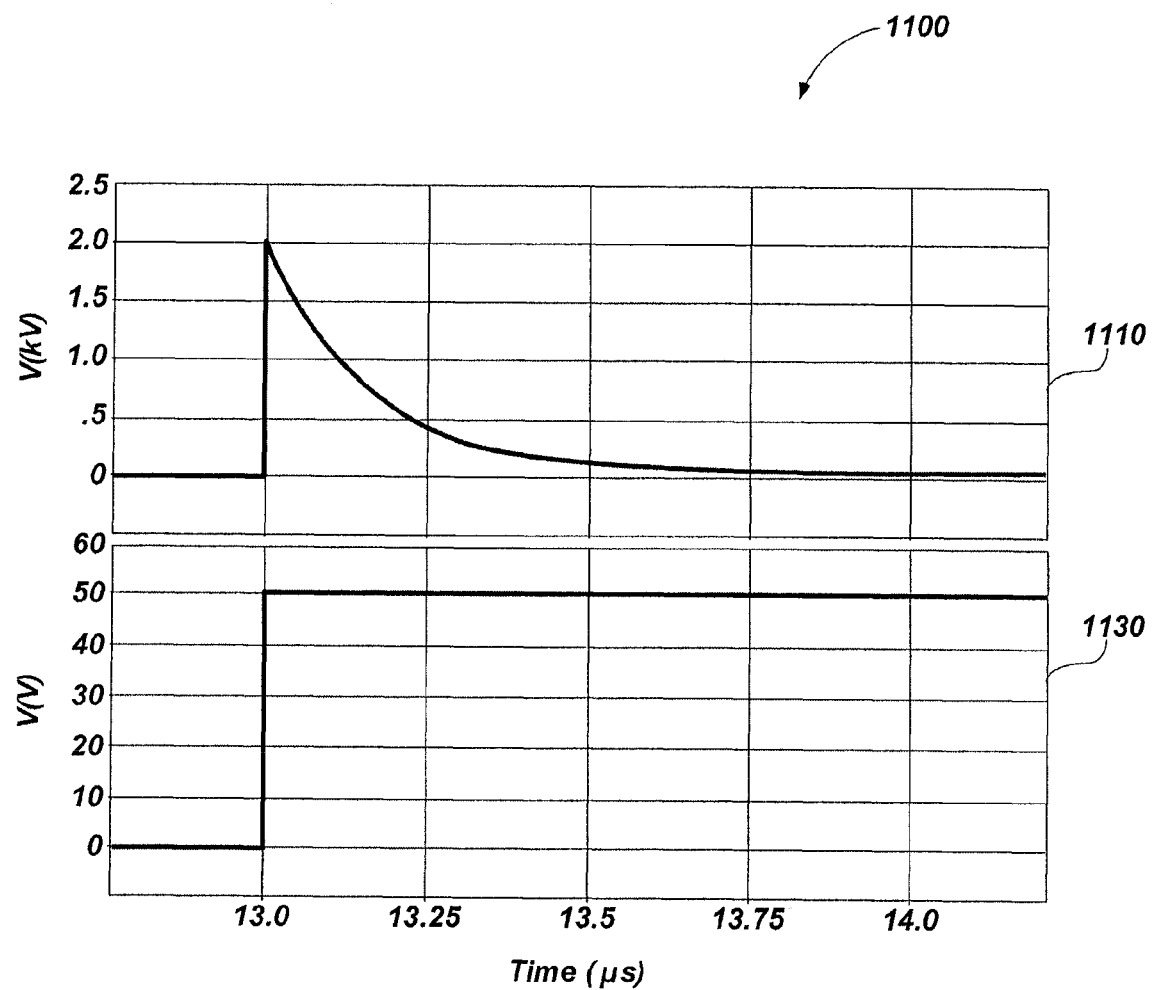
FIG. 11 illustrates a graph of a second human body model simulation of a silicon-controlled rectifier-based ESD clamp according to an embodiment of the present invention.

FIG. 11 illustrates a graph 1100 of a second HBM simulation of the SCR-based ESD protection device 900 according to an embodiment of the present invention. In this simulation, threshold trigger 890 exists and is configured to allow bond pad 760 to have a normal operating range and set the actual clamping voltage at a predefined maximum level. In this example, the maximum desired voltage on the bond pad 760 is desired to be about 50V such that the threshold trigger 890 is configured to allow the bond pad 760 to operate between 0-50V. The same HBM 2 kV zap is given at t =13 as shown in the upper portion 1110 of graph 1100. In the lower portion 1130, it is shown that the threshold trigger 890 clamps for voltages above the maximum desired voltage for the bond pad 760, and that the greatest voltage experienced by the bond pad is about 50V. In this example, the clamp conduction path goes through the first P-N junction of the SCR (i.e., PNP base-emitter junction diode) and then through the optional trigger circuit. This mode of operation is most applicable to simulations because a very large avalanche trigger diode may be required for threshold trigger 890 if it is to also act as an ESD clamping device.

If Vdd =0V (i.e., the enabling signal =0V), then the threshold trigger 890 will limit the voltage by turning on the clamp for the predefined desired maximum voltage. If Vdd =3.3V, the threshold trigger 890 may still turn on the clamp at the predefined desired maximum voltage. With Vdd =3.3V, shunt transistor 730 is on, and in some cases, it may be possible for the shunt transistor 730 to limit the voltage before the threshold trigger 890 value depending on the resistances of the shunt transistor 730 and the beta of the SCR.

Figure 12:
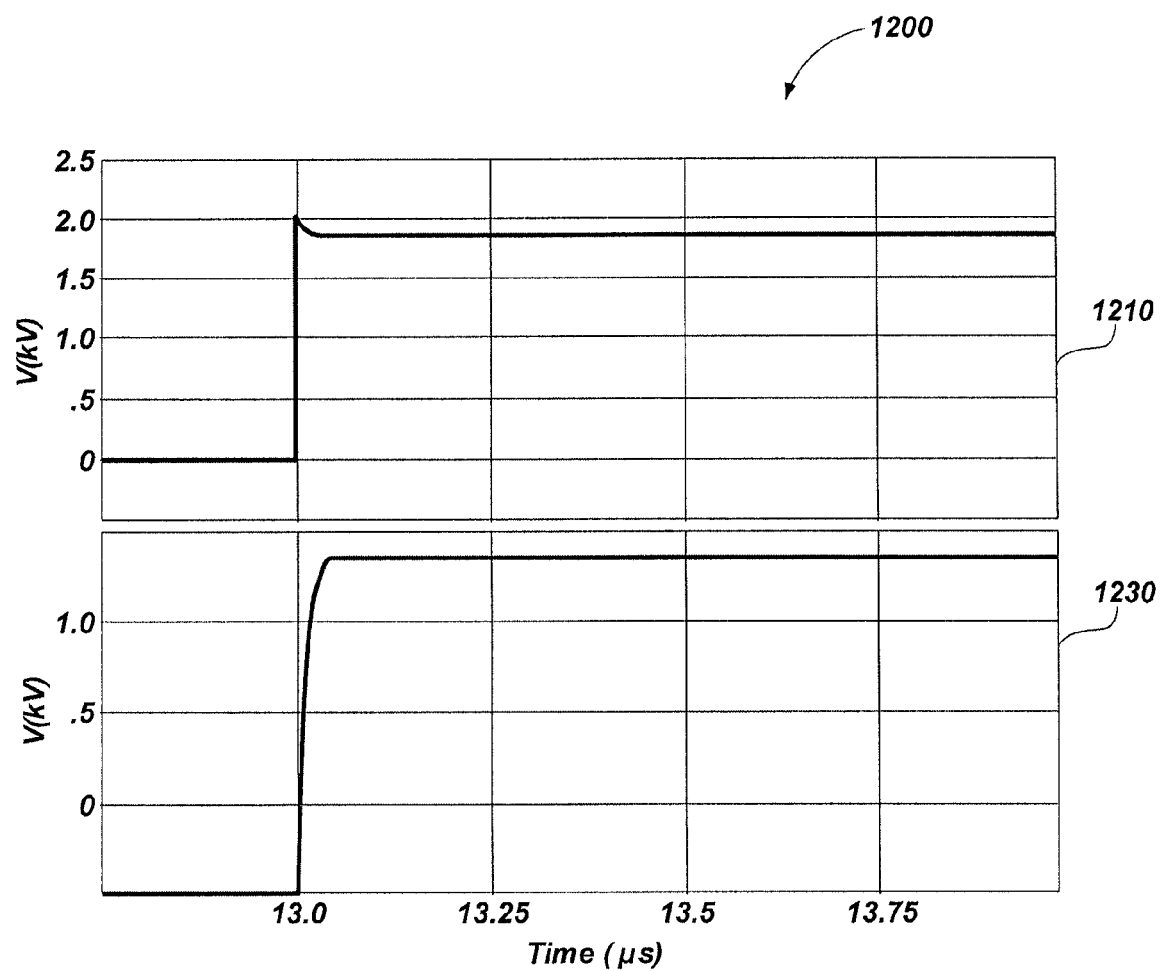
FIG. 12 illustrates a graph of a third human body model simulation of a silicon-controlled rectifier-based ESD clamp according to an embodiment of the present invention.

FIG. 12 illustrates a graph 1200 of a third HBM simulation of a SCR-based ESD protection device 900 according to an embodiment of the present invention. The upper portion 1210 of the graph 1200 shows the voltage at the top of capacitor 954 as before to simulate the human body-produced ESD event. The lower portion 1230 of the graph 1200 shows the voltage over time of the bond pad 760. It should be noted that this graph 1200 is measured in kVolts at the bond pad voltage as well as the capacitor 954 voltage.

In this simulation, Vdd =3.3V, and threshold trigger 890 does not exist in order to isolate the proper function of the shunt transistor 730. The lower portion 1230 of graph 1200 shows that the SCR-based ESD protection device 900 does not trigger falsely when Vdd is applied and equal to 3.3V. In this simulation, the SCR does not trigger because Vdd causes shunt transistor 730 to be on and in its low resistance state. The lower portion 1230 shows that the SCR does not clamp through the shunt transistor 730, and that the voltage on the bond pad 760 remains at approximately 2 kV. Thus, FIG. 12 shows that dynamic turn-on is successfully avoided with no false triggering from the parasitic capacitance created by a large dV/dt. It should be noted that for this simulation, the breakdown of the PNP transistor 710 and NPN transistor 720 is not included in the model, but exists in real silicon. In other words, this simulation illustrates the ability of the shunt transistor to absorb displacement current due to large dV/dt and is not how a real world circuit would necessarily behave because the breakdown voltage of the SCR is not included.

A SCR-based ESD clamp may reduce die area by more than ½ A while also delivering excellent electrical clamping performance when compared to common practice ESD clamps. This smaller design may be accomplished because SCRs are able to handle a much higher current density than conventional ESD clamps. However, designers were reluctant to use SCR clamps due to false triggering and the resulting latched clamp state. Embodiments of the present invention maintain the positive attributes of a SCR ESD clamp while reducing undesirable false triggering.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. An electrostatic discharge protection device, comprising:
   a silicon-controlled rectifier including an anode, a cathode, and a first gate, and a parasitic capacitance between the first gate and an internal node of the silicon-controlled rectifier;
   a shunt path connecting the cathode and the first gate of the silicon-controlled rectifier, wherein the shunt path includes an input terminal that is different than the first gate of the silicon-controlled rectifier, the input terminal configured to receive an enabling signal that is different than an activation signal received by the first gate of the silicon-controlled rectifier, and wherein the shunt path is configured to:
      allow a conductive path for a displacement current from the parasitic capacitance responsive to the enabling signal being enabled; and
      allow the silicon-controlled rectifier to enter a low resistance state responsive to the enabling signal being disabled and a breakdown voltage is applied between the anode and the cathode; and
   a first resistor coupled between the input terminal of the shunt path and the cathode of the silicon-controlled rectifier.

2. The electrostatic discharge protection device of claim 1, wherein the silicon-controlled rectifier is configured to behave as a PNP transistor coupled with an NPN transistor, wherein the base of the PNP transistor is electrically coupled with the collector of the NPN transistor, and the base of the NPN transistor is electrically coupled with the collector of the PNP transistor.

3. The electrostatic discharge protection device of claim 1, wherein the silicon-controlled rectifier is configured to allow current to flow through the silicon-controlled rectifier if confronted by an electrostatic discharge between the anode and the cathode.

4. The electrostatic discharge protection device of claim 1, further comprising a second resistor coupled between the input terminal of the shunt path and a node coupling the first resistor and a power supply.

5. The electrostatic discharge protection device of claim 1, wherein the shunt path includes a shunt transistor connected between the first gate and the cathode of the silicon-controlled rectifier, and the enabling signal is configured to be generated from a power supply electrically coupled with a gate of the shunt transistor.

6. The electrostatic discharge protection device of claim 1, further comprising a bond pad electrically coupled with the anode of the silicon-controlled rectifier.

7. The electrostatic discharge protection device of claim 5, wherein the shunt transistor is a low voltage NMOS transistor.

8. The electrostatic discharge protection device of claim 1, further comprising a threshold trigger circuit operably coupled between a second gate of the silicon-controlled rectifier and the cathode of the silicon-controlled rectifier, wherein the threshold trigger circuit is configured to provide a path for current to flow through a portion of the silicon-controlled rectifier and the threshold trigger if a voltage at the anode is at a predetermined value lower than a breakdown voltage of the silicon-controlled rectifier to turn on the silicon-controlled rectifier.

9. The electrostatic discharge protection device of claim 8, wherein the threshold trigger circuit comprises one or more reverse-biased avalanche breakdown diodes connected in series between the second gate and the cathode of the silicon-controlled rectifier.

10. The electrostatic discharge protection device of claim 8, wherein the threshold trigger circuit is configured to allow current to flow from a path through a first P-N junction of the silicon-controlled rectifier and the threshold trigger circuit if the voltage at the anode is approximately equal to a breakdown voltage of the threshold trigger circuit plus a voltage across the first P-N junction.

11. A circuit for protecting a bond pad, the circuit comprising:
a silicon-controlled rectifier including an anode, a cathode, a first gate, and a second gate;
a shunt path coupled between the first gate and the cathode;
a bond pad connected to the anode; and
a threshold trigger circuit including one or more diodes operably coupled between the second gate and the cathode of the silicon-controlled rectifier, wherein the threshold trigger circuit is configured to provide a current path through a first P-N junction of the silicon-controlled rectifier and the threshold trigger circuit if the anode voltage reaches a predetermined value lower than a breakdown voltage of the silicon-controlled rectifier.

12. The circuit of claim 11, wherein the one or more diodes include a plurality of reverse-avalanche breakdown diodes that have a total breakdown voltage that is lower than the breakdown voltage of the silicon-controlled rectifier.

13. The circuit of claim 12, wherein the threshold trigger circuit is configured to allow current to flow through the current path through the first P-N junction of the silicon-controlled rectifier and the threshold trigger circuit if the voltage at the anode is approximately equal to a combined voltage the total breakdown voltage of the plurality of reverse-avalanche breakdown diodes of the threshold trigger circuit plus a Vbe voltage across the first P-N junction.

14. The circuit of claim 11, wherein the shunt path comprises a shunt resistor connected between the first gate and the cathode of the silicon-controlled rectifier.

15. The circuit of claim 11, wherein the shunt path is configured to:
allow a conductive path for a displacement current from a parasitic capacitance between the first gate and an internal node of the silicon-controlled rectifier if the shunt path is enabled by an enabling signal that is different than the first gate of the silicon-controlled rectifier; and
allow the silicon-controlled rectifier to enter a low resistance state if the shunt path is disabled by the enabling signal and a breakdown voltage is applied between the anode and the cathode.

16. A method for protecting a circuit from electrostatic discharge, the method comprising:
providing a controlled current path between a bond pad and ground with a silicon-controlled rectifier, having a first gate; and
providing a controllable shunt path between the first gate and the ground, wherein the controllable shunt path is at a low resistance if an enabling signal at an input terminal of the controllable shunt path is enabled, and wherein the shunt path is at a high resistance if the enabling signal at the input terminal of the controllable shunt path is disabled; and
providing a resistive path between the input terminal of the controllable shunt path and the ground, wherein the input terminal of the controllable shunt path is different than the first gate of the silicon-controlled rectifier.

17. The method of claim 16, wherein providing the controllable shunt path includes allowing displacement current from parasitic capacitance to flow through the controllable shunt path if the enabling signal at input terminal of the controllable shunt path is enabled by being operably coupled to a power supply.

18. The method of claim 16, wherein providing the controllable shunt path includes connecting a shunt transistor between the first gate of the silicon-controlled rectifier and the ground, and further comprising operably coupling a gate of the shunt transistor with a power supply connection, wherein the gate of the shunt transistor is the input terminal of the controllable shunt path.

19. The method of claim 16, further comprising operably coupling a threshold trigger circuit between a second gate of the silicon-controlled rectifier and the ground to provide a current path through the silicon-controlled rectifier if the voltage between the bond pad and the ground reaches a predetermined value set by the threshold trigger circuit and less than a breakdown voltage of the silicon-controlled rectifier.

20. A method for protecting a bond pad from excessive voltage, the method comprising:
connecting a silicon-controlled rectifier between a bond pad and ground, the silicon-controlled rectifier having a first gate and a second gate;
connecting a shunt path to the first gate;
connecting a threshold trigger including one or more diodes in series between the second gate of the silicon-controlled rectifier and the ground, wherein the threshold trigger allows a voltage on the bond pad up to a normal operating voltage and triggers the silicon-controlled rectifier to clamp when the voltage on the bond pad reaches a predetermined level below a breakdown voltage of the silicon-controlled rectifier that is approximately a breakdown voltage of the one or more diodes.

21. The method of claim 20, wherein the breakdown voltage of the one or more diodes is substantially equal to a desired maximum voltage on the bond pad.

22. The method of claim 20, further comprising allowing current to flow through a base-emitter junction of the silicon-controlled rectifier and the threshold trigger circuit if a voltage at the bond pad reaches the predetermined level below the breakdown voltage of the silicon-controlled rectifier causing the second gate of the silicon-controlled rectifier to turn on.

23. An integrated circuit, comprising:
a plurality of semiconductor devices; and
at least one electrostatic discharge protection circuit, the at least one electrostatic discharge protection circuit comprising:
a silicon-controlled rectifier including an anode, a cathode, and a gate;
a shunt path coupled between the gate and the cathode of the silicon-controlled rectifier, wherein the shunt path includes an input terminal to control operation of the shunt path, the input terminal receiving an enabling signal that is different than an input signal to the gate, and wherein the shunt path is configured to have a low resistance if the integrated circuit is mounted and powered, and wherein the shunt path is configured to have a high resistance if the integrated circuit is not receiving power; and a resistor coupled between the input of the shunt path and the cathode of the silicon-controlled rectifier.

24. The integrated circuit of claim 23, wherein the shunt path comprises at least one transistor coupled between the gate and the cathode of the silicon-controlled rectifier, and wherein a gate of the transistor is the input and is coupled with a Vdd pad.

25. The integrated circuit of claim 23, wherein the at least one transistor is selected from the group consisting of an NMOS, PMOS, and bipolar junction transistor.

* * * * *